United States Patent [19]
Gardner et al.

[11] Patent Number: 6,162,687
[45] Date of Patent: Dec. 19, 2000

[54] METHOD OF MANUFACTURING SEMICONDUCTOR DEVICE HAVING OXIDE-NITRIDE GATE INSULATING LAYER

[75] Inventors: Mark I. Gardner, Cedar Creek; H. Jim Fulford; Charles E. May, both of Austin, all of Tex.

[73] Assignee: Advanced Micro Devices, Inc., Sunnyvale, Calif.

[21] Appl. No.: 09/136,464

[22] Filed: Aug. 19, 1998

[51] Int. Cl.[7] .................................................. H01L 21/336
[52] U.S. Cl. .......................... 438/287; 438/216; 438/591
[58] Field of Search .................................... 438/216, 261, 438/287, 591, 762, 763, 769, 954

[56] References Cited

U.S. PATENT DOCUMENTS

| | | | |
|---|---|---|---|
| 4,980,307 | 12/1990 | Ito et al. | 438/591 |
| 5,258,333 | 11/1993 | Shappir et al. | 438/591 |
| 5,464,783 | 11/1995 | Kim et al. | 438/287 |
| 5,489,542 | 2/1996 | Iwai et al. | 438/287 |
| 5,712,208 | 1/1998 | Tseng et al. | 438/287 |
| 5,880,508 | 12/1999 | Wu | 438/287 |

*Primary Examiner*—Chandra Chaudhari

[57] ABSTRACT

Generally, the present invention relates to semiconductor devices having an oxide-nitride gate insulating layer and methods of manufacture thereof. Consistent with the present invention a semiconductor device is formed by forming a nitrogen bearing oxide layer over a substrate and forming a nitride layer over the nitrogen bearing oxide layer. The thickness of the nitride layer is reduced and the nitride layer is annealed in an $NH_3$ bearing ambient. The $NH_3$ anneal may, for example, be performed before or after or while reducing the thickness of the nitride layer. One or more of the gate electrodes may then be formed over the nitride layer using the nitrogen bearing oxide layer and the nitride layer to insulate the gate electrode(s) from the substrate. This technique can, for example, provide a highly reliable and scaled gate insulating layer.

18 Claims, 4 Drawing Sheets

METHOD OF MANUFACTURING SEMICONDUCTOR DEVICE HAVING OXIDE-NITRIDE GATE INSULATING LAYER

FIELD OF THE INVENTION

The present invention is directed generally to semiconductor devices, and more particularly to semiconductor devices having an oxide-nitride gate insulating layer and methods of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate oxide layer. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation. It is important to carefully control the growth of the gate oxide layer because the thickness and uniformity of the gate oxide layer can significantly impact the overall operation of the device being formed. For example, the drain current in a MOS transistor is inversely proportional to the gate-oxide thickness at a given set of terminal voltages. Accordingly, it is normally desired to make the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to semiconductor devices having an oxide-nitride gate insulating layer and methods of manufacture thereof. Consistent with the present invention a semiconductor device is formed by forming a nitrogen bearing oxide layer over a substrate and forming a nitride layer over the nitrogen bearing oxide layer. The thickness of the nitride layer is reduced and the nitride layer is annealed in an $NH_3$ bearing ambient. The $NH_3$ anneal may, for example, be performed before or after or while reducing the thickness of the nitride layer. One or more of the gate electrodes may then be formed over the nitride layer using the nitrogen bearing oxide layer and the nitride layer to insulate the gate electrode(s) from the substrate. This technique can, for example, provide a highly reliable and scaled gate insulating layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
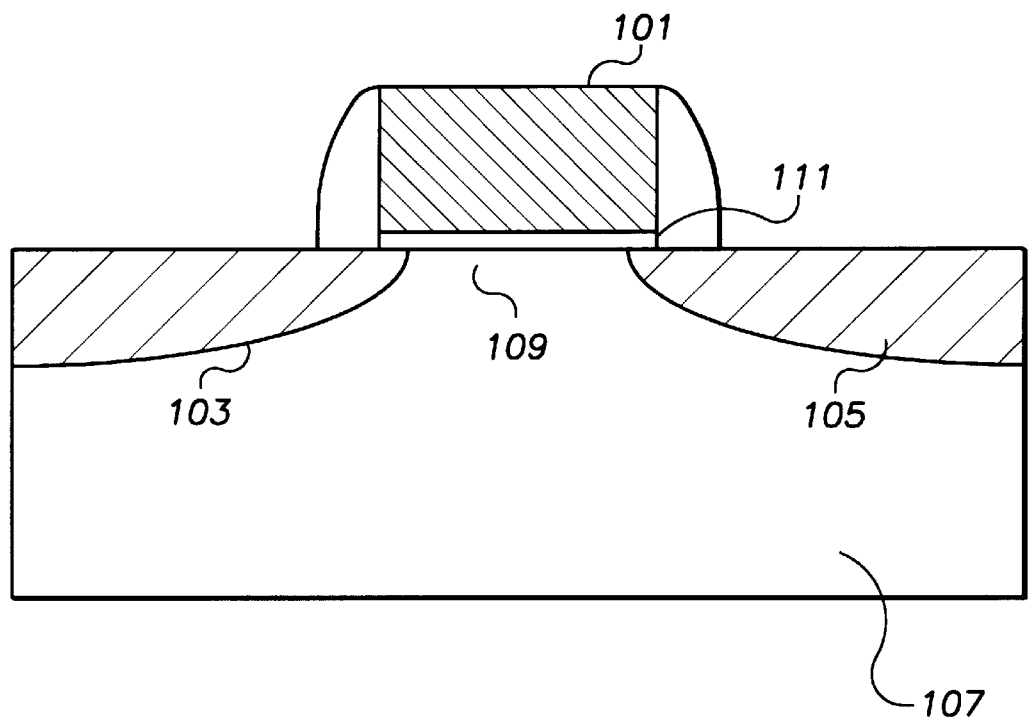
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of semiconductor devices which have a gate electrode disposed on an gate insulating layer. The invention is believed to be particularly advantageous in applications where it is desirable to form a gate insulating layer using a nitride. While the present invention is not so limited, an appreciation of various aspects of the invention is best gained through a discussion of various application examples of processes used to form such semiconductor devices.

Figure 2A:
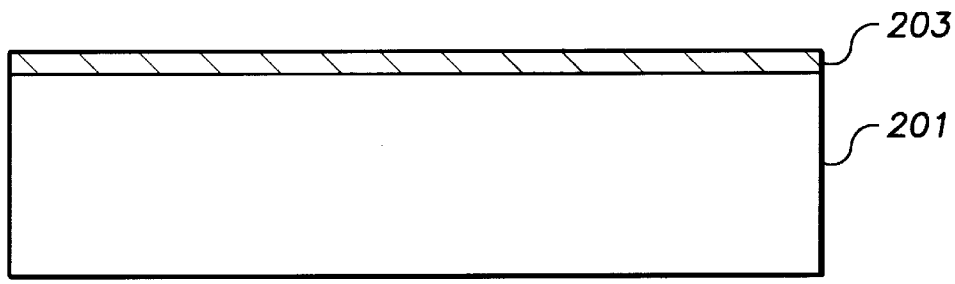
FIGS. 2A–2E illustrate an exemplary process in accordance with one embodiment of the invention.

FIGS. 2A–2E illustrate an exemplary process for fabricating a semiconductor device in accordance with one embodiment of the invention. In this process, a nitrogen bearing oxide (oxynitride) layer 203 is formed on a substrate 201, typically a silicon substrate, as illustrated in FIG. 2A. The oxynitride layer 203 may be formed by growing an oxide in an ambient of one or more nitrogen-bearing species, such as NO or $N_2O$. One particular technique includes annealing the substrate 201 in an NO ambient (80% NO by volume, with the remainder being inert) at relatively low temperature (e.g., ranging from 800 to 950° C.). This anneal may take place in a number of different reaction chambers including e.g., a diffusion tube or single chamber rapid thermal anneal (RTA) chamber. Using this technique, relatively uniform thicknesses of the oxynitride layer 203 ranging from 5 to 10 angstroms (Å) may be provided.

Following the growth of the oxynitride layer 203, the substrate 201 may optionally be annealed in inert an ambient. The inert ambient typically contains one or more inert species such as argon or nitrogen and is usually carried out at relatively high temperatures (e.g., ranging from 950 to 1100° C.). This anneal serves to improve the oxynitride-substrate interface and reduce the number of dangling bonds between the oxynitride layer 203 and substrate 201.

Figure 2B:
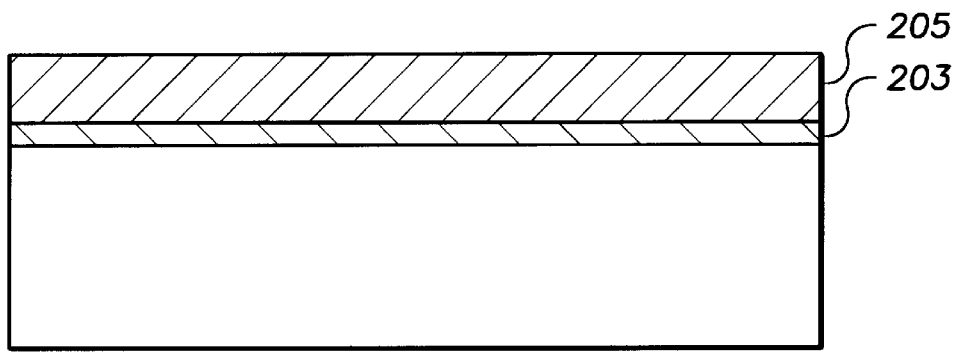

A nitride layer 205, such as a silicon nitride layer, is formed over the oxynitride layer 203, as illustrated in FIG. 2B. The nitride layer 205 may be formed using, for example, well-known jet vapor or chemical vapor deposition techniques. The thickness of the nitride layer 205 will be reduced in later processing. Typically the thickness of the nitride layer 205 is minimized while maintaining a uniform thickness. This enhances the removal of a portion of the nitride layer 205 in subsequent processing. Using most deposition techniques, typical thicknesses for the nitride layer 205 range from about 15 to 30 Å for many applications.

Figure 2C:
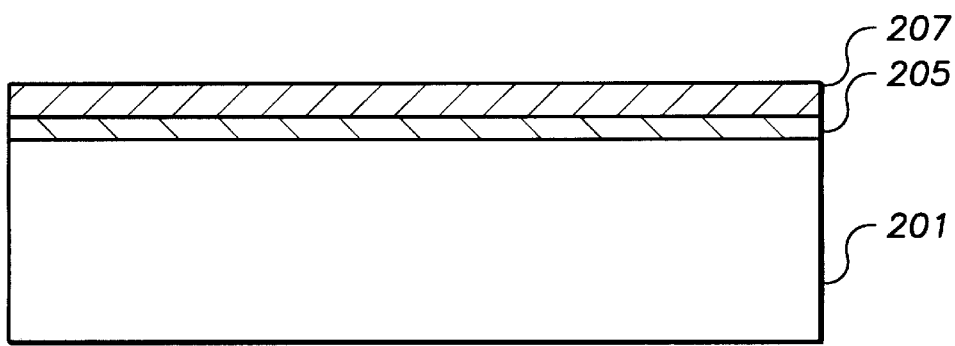

Part of the nitride layer 205 is removed to form a thinner nitride layer 207, as illustrated in FIG. 2C. The nitride removal step may be performed using a number of different techniques. In one particular embodiment, the nitride layer 205 is selectively removed by dipping the nitride layer 205 in a hydrofluoric acid solution, e.g., a 10:1 H:F solution. In another embodiment, the nitride layer 205 is partially removed by flowing hydrofluoric or hydrochloric gas over the nitride layer 205. The latter embodiments may, in particular, be used where it is desirable to incorporate fluorine or chlorine into the nitride layer 207 and/or the oxynitride layer 203. The oxynitride layer 205 and nitride layer 207 will be used, at least in part, as a gate insulating layer. The amount of nitride removed is typically chosen in consideration of the capacitive characteristics of the two layers 205 and 207, taking into account reliability concerns. Using the above techniques, thicknesses of the nitride layer 207 ranging from about 5 to 15 angstroms may be provided.

One of the problems found with using nitride as part of a gate insulating layer is the present of excessive traps and charges. These features can deleteriously impact device performance or by, for example, varying the threshold voltage of the device. To overcome these problems, following the nitride removal, the substrate 201 is typically annealed in an $NH_3$ bearing ambient. The $NH_3$ serves to passivate the nitride layer 207 and reduce the number of traps and charges therein. The $NH_3$ anneal can also introduce additional nitrogen into and further enhance the qualities of the oxynitride layer 203 and oxynitride-substrate interface. The characteristics of the $NH_3$ anneal, such as time, temperature and $NH_3$ concentration, can vary depending on the thickness of the nitride layer 207 as well as the desired amount of nitrogen incorporation into the oxynitride layer 203 and oxynitride-substrate interface. Annealing the substrate for 30 to 120 seconds at 850 to 1000° C. in a 30% by volume ambient of $NH_3$ would be suitable for many applications. This anneal process when applied to 5 to 15 Å of nitride typically introduces nitrogen into the oxynitride layer 203 and substrate interface. The time, temperature and/or concentration of $NH_3$ may be reduced to lessen or prevent nitrogen incorporation in the oxynitride layer 205 or the oxynitride-substrate interface. In an alternate embodiment, the nitride layer 205 (prior to thinning) may be annealed in an $NH_3$ ambient to passivate the nitride. This technique may be used, for example, when little if any nitrogen is desired to be incorporated in the oxynitride layer 203 or substrate interface. In this case, the anneal time is typically increased (e.g., to 45 to 180 seconds) to suitably passivate the thicker nitride layer 205.

Figure 2D:
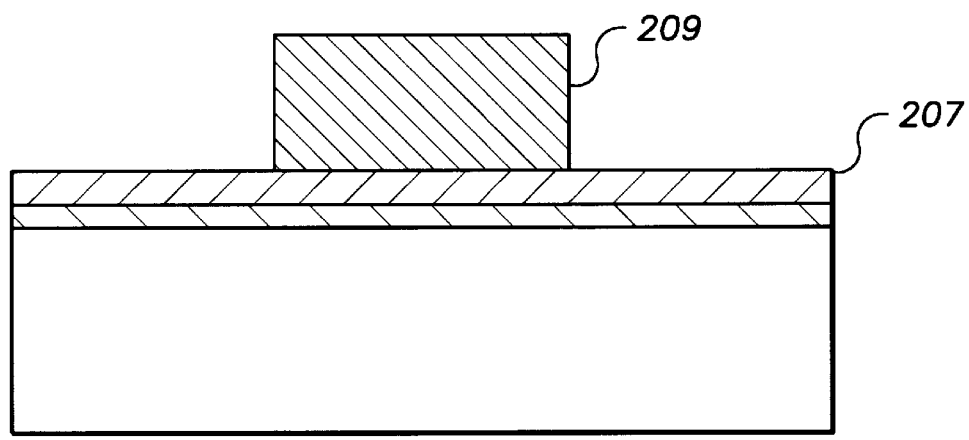
Figure 2E:
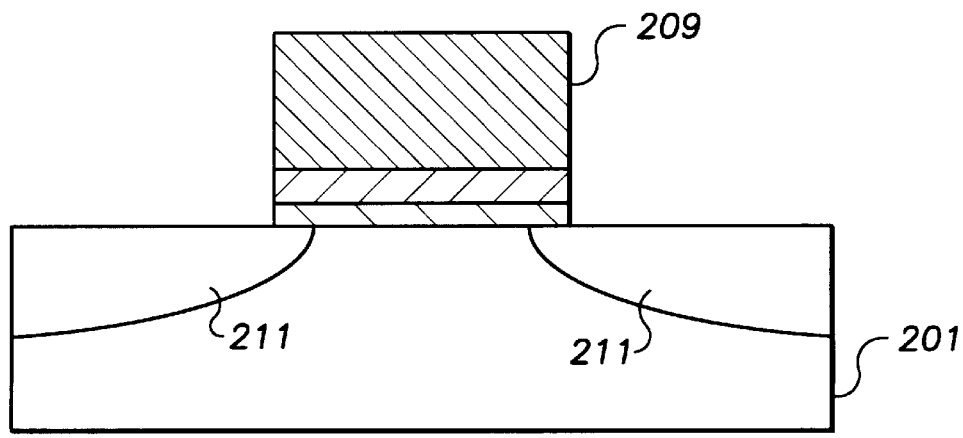

One or more gate electrodes (only one of which is shown) are typically formed over the nitride layer 207 as shown in FIG. 2D. The gate electrode 209 may be formed using a number of different techniques. For instance, the gate electrode may be formed by depositing a layer of polysilicon over the nitride layer 207 and selectively etching the polysilicon layer using well-known photolithography techniques. Fabrication of the semiconductor device may continue with well-known processing steps such as source/drain formation, silicidation, contact formation, and so forth, to complete the device structure. For example, source/drain regions 211 may be formed adjacent the gate electrode 209 by implanting dopants (e.g. boron or arsenic) into the substrate 201 using the gate electrode 209 for alignment. This may be performed by implanting the dopants through the nitride layer 207 and oxynitride layer 205 or by removing these layers and then implanting the dopants. The formation of the source/drain regions may be done using well-known techniques. The resultant structure, shown after removal of the nitride and oxynitride layers from the source/drain regions, is depicted in FIG. 2E.

Figure 3A:
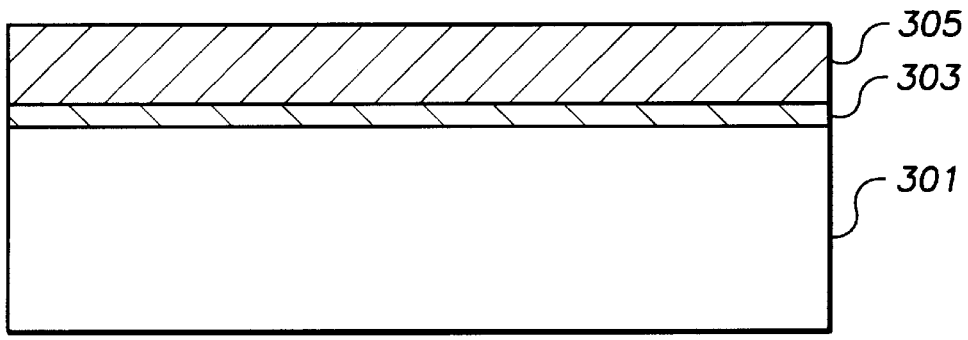
FIGS. 3A–3C illustrate an exemplary process in accordance with another embodiment of the invention.

FIGS. 3A–3E illustrate another exemplary process for fabricating a semiconductor device having an oxide-nitride gate insulating layer. In this process, a nitride layer 305 (e.g., silicon nitride) and an oxide layer 303 (e.g., oxynitride layer) are formed over a substrate 301 in a similar manner as discussed above with respect to FIGS. 2A and 2B. The resultant structure is illustrated in FIG. 3A.

Figure 3B:
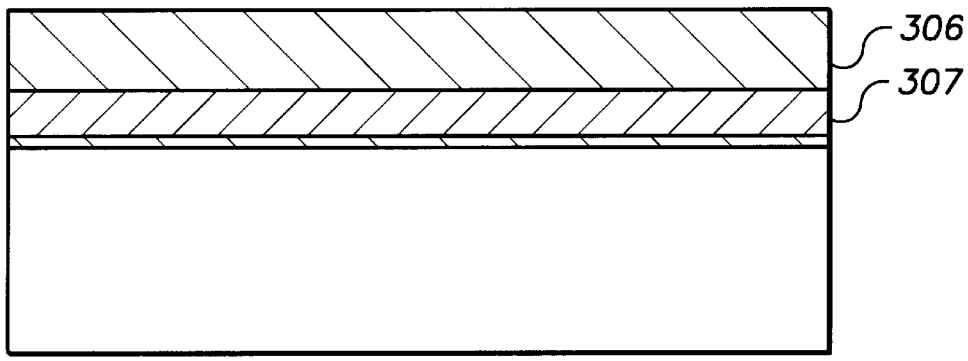

In this process, the nitride layer 305 is oxidized to convert a portion of the nitride layer 305 to an oxide 306 and leave a thinner nitride layer 307, as shown in FIG. 3B. The oxidation process provides a high controllable and uniform method of reducing the thickness of the nitride layer 305. The thickness of the nitride layer 305 may, for example be reduced to 5 to 15 Å. The nitride layer 305 may be oxidized using a number of techniques. In one particular embodiment, the oxidation is performed by annealing the substrate 301 in an oxygen (e.g., O, $O_2$, or NO) and $NH_3$ ambient. In this manner, the nitride layer 305 may be partially converted to oxide while the remaining nitride is passivated in the same process. One suitable oxidation technique includes heating the substrate 301 for 30 to 120 seconds at 1000 to 1150° C. in an ambient of 70% NO and 20% $NH_3$ by volume, with the remainder being inert gas.

In alternate embodiments, the oxidation and $NH_3$ passivation may be performed separately. For instance, the nitride layer 305 may be oxidized in an oxygen ambient with the nitride of layer 307 being passivated before oxidation or after removal of the grown oxide 306.

Figure 3C:
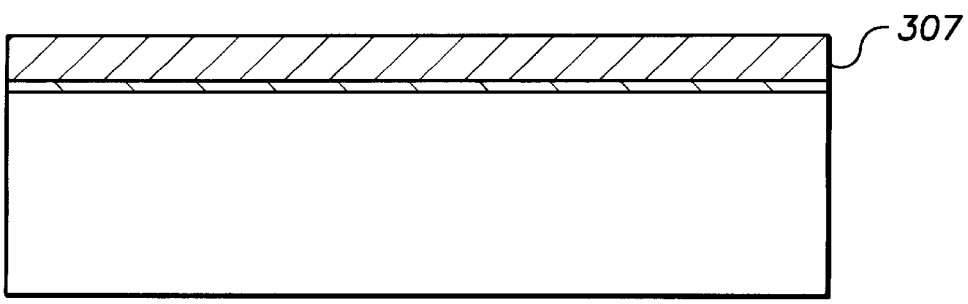

Turning back to the illustrated process the grown oxide 306 is then removed as illustrated in FIG. 3C. This may be performed using known plasma or wet chemistry etching techniques. Fabrication may continue with gate electrode formation, source/drain formation, silicidation and so forth to complete the device structure as discussed above.

Using the above processes, a semiconductor device having an oxide-nitride gate insulating layer can be formed with improved reliability and scaled capacitive characteristics. Using, for example, 5 Å of oxynitride (k of about 4) and 5 to 15 Å of silicon nitride (k of about 8), the gate insulating is provided with capacitive characteristics equivalent to 7.5 to 12.5 Å of $SiO_2$. In this manner, the oxide-nitride gate insulating layer significantly scales down the semiconductor device. The passivation of the nitride layer by an $NH_3$ anneal, moreover, improves device characteristics by minimizing charge storing by the nitride. The use of an $NH_3$ anneal may also be used to incorporate nitrogen in the oxide layer as well as the substrate interface. This can further improve the characteristics of the gate insulating layer.

The present invention is applicable to the fabrication of a number of different devices which may benefit from having an oxide-nitride gate insulating layer. Such devices include, but are not limited to, MOS, CMOS, and BiCMOS structures. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:
   forming a nitrogen bearing oxide layer over a substrate;
   forming a nitride layer over the nitrogen bearing oxide layer; and
   reducing a thickness of the nitride layer and then annealing the nitride layer in an $NH_3$ bearing ambient; and
   forming one or more gate electrodes over the nitride layer.

2. The process of claim 1, wherein forming the nitrogen bearing oxide layer includes annealing the substrate in a nitrogen and oxygen bearing ambient.

3. The process of claim 2, further including annealing the nitrogen bearing oxide layer in an inert ambient after annealing the substrate.

4. The process of claim 1, wherein forming the nitride layer includes depositing a silicon nitride layer.

5. The process of claim 4, wherein the deposited silicon nitride layer has a thickness ranging from 15 to 30 angstroms.

6. The process of claim 1, wherein reducing the thickness of the nitride layer includes etching the nitride layer.

7. The process of claim 6, wherein etching the nitride layer includes contacting the nitride layer with a hydrofluoric acid.

8. The process of claim 6, wherein etching the nitride layer includes contacting the nitride layer with a hydrochloric acid.

9. The process of claim 1, wherein reducing the thickness of the nitride layer includes oxidizing the nitride layer to convert a portion of the nitride layer to an oxide and removing the oxide to leave a portion of the nitride layer.

10. The process of claim 9, wherein annealing the nitride layer in the $NH_3$ bearing ambient is performed before oxidizing the nitride layer.

11. The process of claim 9, wherein annealing the nitride layer in the $NH_3$ bearing ambient is performed after oxidizing the nitride layer.

12. The process of claim 11, wherein annealing the nitride layer includes providing nitrogen into the nitrogen bearing oxide layer.

13. The process of claim 9, wherein annealing the nitride layer in the $NH_3$ bearing ambient is performed while oxidizing the nitride layer.

14. The process of claim 13, wherein annealing the nitride layer includes providing nitrogen into the nitrogen bearing oxide layer.

15. A process of fabricating a semiconductor device, comprising:
   annealing a substrate in a nitrogen and oxygen bearing ambient to grow an oxynitride layer on the substrate;
   depositing a silicon nitride layer over the oxynitride layer;
   reducing a thickness of the silicon nitride layer and then annealing the silicon nitride layer in an $NH_3$ bearing ambient to passivate the nitride layer and incorporate nitrogen in the oxynitride layer; and
   forming one or more gate electrodes over the silicon nitride layer.

16. The process of claim 15, wherein annealing the silicon nitride includes providing nitrogen into the oxynitride layer.

17. The process of claim 15, wherein annealing the silicon nitride includes providing nitrogen into the oxynitride layer.

18. The process of claim 15, wherein reducing the thickness of silicon nitride layer and annealing the silicon nitride layer in the $NH_3$ bearing ambient include:
   oxidizing the silicon nitride layer in an $NH_3$ bearing ambient to convert a portion of the silicon nitride layer to an oxide and to passivate a remaining portion of the nitride layer; and
   removing the oxide to leave the remaining portion of the nitride layer, wherein the one or more gate electrodes are formed over the remaining nitride layer.

* * * * *